United States Patent
Kim et al.

(10) Patent No.: US 11,967,736 B2
(45) Date of Patent: Apr. 23, 2024

(54) BATTERY MODULE COMPRISING INCLUDING CHAMFERED INNER COVER AND CHAMFERED HOUSING TO PREVENT DAMAGE DURING ASSEMBLY

(71) Applicant: LG CHEM, LTD., Seoul (KR)

(72) Inventors: Jeong-Hyeon Kim, Daejeon (KR); Do-Hyun Park, Daejeon (KR); Jun-Yeob Seong, Daejeon (KR); Jong-Ha Jeong, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 638 days.

(21) Appl. No.: 17/263,852

(22) PCT Filed: Dec. 19, 2019

(86) PCT No.: PCT/KR2019/018145
§ 371 (c)(1),
(2) Date: Jan. 27, 2021

(87) PCT Pub. No.: WO2020/138849
PCT Pub. Date: Jul. 2, 2020

(65) Prior Publication Data
US 2021/0320385 A1     Oct. 14, 2021

(30) Foreign Application Priority Data
Dec. 26, 2018 (KR) .................. 10-2018-0169969

(51) Int. Cl.
*H01M 50/505* (2021.01)
*H01M 10/42* (2006.01)
(Continued)

(52) U.S. Cl.
CPC ....... *H01M 50/505* (2021.01); *H01M 10/425* (2013.01); *H01M 10/48* (2013.01);
(Continued)

(58) Field of Classification Search
CPC .. H01M 50/505; H01M 50/249; H01M 50/50; H01M 50/209; H01M 50/287;
(Continued)

(56) References Cited

U.S. PATENT DOCUMENTS

| 5,674,078 A | 10/1997 | Davis et al. |
| 2005/0239335 A1 | 10/2005 | Kadonaga et al. |

(Continued)

FOREIGN PATENT DOCUMENTS

| CN | 1213461 A | 4/1999 |
| CN | 1698240 A | 11/2005 |

(Continued)

OTHER PUBLICATIONS

Extended Search Report dated May 14, 2021 in corresponding EP Patent Application No. 19904110.4.
(Continued)

*Primary Examiner* — Sean P Cullen
(74) *Attorney, Agent, or Firm* — Birch, Stewart, Kolasch & Birch, LLP

(57) ABSTRACT

A battery module minimizes damage to internal configurations generated in an assembly process. The battery module includes a cell assembly provided with an electrode lead and a plurality of secondary batteries stacked; a bus bar assembly provided with a bus bar frame located on a front or rear of the cell assembly, and a bus bar mounted on an outer surface of the bus bar frame; and an inner cover provided with a plate portion located on an outer side of the cell assembly, formed in a plate shape and formed with a chamfer on an outer peripheral portion and a coupling portion coupled to one end portion of the body portion of the bus bar frame on a part of the outer peripheral portion of the plate portion.

12 Claims, 11 Drawing Sheets

(51) Int. Cl.
    *H01M 10/48*     (2006.01)
    *H01M 50/209*    (2021.01)
    *H01M 50/211*    (2021.01)
    *H01M 50/249*    (2021.01)
    *H01M 50/287*    (2021.01)
    *H01M 50/50*     (2021.01)
    *H01M 50/569*    (2021.01)

(52) U.S. Cl.
    CPC ....... *H01M 50/209* (2021.01); *H01M 50/211* (2021.01); *H01M 50/249* (2021.01); *H01M 50/287* (2021.01); *H01M 50/50* (2021.01); *H01M 50/569* (2021.01); *H01M 2010/4271* (2013.01); *H01M 2220/20* (2013.01)

(58) Field of Classification Search
    CPC ............. H01M 50/569; H01M 50/211; H01M 10/425; H01M 10/48
    USPC .................. 429/61, 149, 151, 156, 158, 159
    See application file for complete search history.

(56) References Cited

U.S. PATENT DOCUMENTS

| | | |
|---|---|---|
| 2010/0151299 A1 | 6/2010 | Ha et al. |
| 2013/0302651 A1 | 11/2013 | Kim et al. |
| 2014/0356690 A1 | 12/2014 | Kim |
| 2015/0243450 A1 | 8/2015 | Shimoda et al. |
| 2017/0190264 A1* | 7/2017 | Kim .................... H01M 50/242 |
| 2018/0138565 A1* | 5/2018 | Lee .................... H01M 10/6554 |
| 2018/0175343 A1 | 6/2018 | Choi et al. |
| 2019/0001838 A1 | 1/2019 | Choi et al. |
| 2019/0260099 A1* | 8/2019 | Ju ....................... H01M 50/505 |
| 2019/0348720 A1* | 11/2019 | Oh ...................... H01M 50/567 |
| 2020/0014005 A1 | 1/2020 | Lee et al. |
| 2020/0411815 A1* | 12/2020 | Shin .................. H01M 10/4207 |

FOREIGN PATENT DOCUMENTS

| | | | |
|---|---|---|---|
| CN | 202797343 U | 3/2013 | |
| CN | 203511543 U | 4/2014 | |
| CN | 206022473 U | 3/2017 | |
| EP | 3340345 A1 | 6/2018 | |
| JP | 2014-078372 A | 5/2014 | |
| JP | 2018-113097 A | 7/2018 | |
| KR | 10-0892046 B1 | 4/2009 | |
| KR | 10-2014-0131715 A | 11/2014 | |
| KR | 10-1459400 B1 | 11/2014 | |
| KR | 10-2014-0140380 A | 12/2014 | |
| KR | 10-2017-0082041 A | 7/2017 | |
| KR | 10-2017-0135597 A | 12/2017 | |
| KR | 10-1794937 B1 | 12/2017 | |
| KR | 10-2018-0038253 A | 4/2018 | |
| KR | 10-2018-0099440 A | 9/2018 | |
| KR | 10-2018-0135701 A | 12/2018 | |
| WO | WO-2018124751 A1 * | 7/2018 | .............. B60L 50/64 |
| WO | WO-2018230857 A1 * | 12/2018 | ........... H01M 10/425 |

OTHER PUBLICATIONS

International Search Report for PCT/KR2019/018145 (PCT/ISA/210) dated Apr. 3, 2020.

* cited by examiner

BATTERY MODULE COMPRISING INCLUDING CHAMFERED INNER COVER AND CHAMFERED HOUSING TO PREVENT DAMAGE DURING ASSEMBLY

TECHNICAL FIELD

The present disclosure relates to a battery module including an inner cover, and more particularly, to a battery module that minimizes damage to internal configurations generated in an assembly process.

The present application claims priority to Korean Patent Application No. 10-2018-0169969 filed on Dec. 26, 2018 in the Republic of Korea, the disclosures of which are incorporated herein by reference.

BACKGROUND ART

Recently, as the demand for portable electronic products such as laptops, video cameras, mobile phones, etc. has rapidly increased, and electric vehicles, energy storage batteries, robots, and satellites have been developed in earnest, research into high-performance secondary batteries that can be repeatedly charged and discharged has been actively conducted.

Currently commercialized secondary batteries include nickel cadmium batteries, nickel hydrogen batteries, nickel zinc batteries, lithium secondary batteries, and the like. Among these secondary batteries, because lithium secondary batteries have almost no memory effect compared to nickel-based secondary batteries, lithium secondary batteries are in the spotlight owing to the advantages of free charge and discharge, very low self discharge rate, and high energy density.

Such a lithium secondary battery mainly uses lithium-based oxides and carbon materials as positive electrode active materials and negative electrode active materials, respectively. The lithium secondary battery includes an electrode assembly in which a positive electrode plate and a negative electrode plate coated with a positive electrode active material and a negative electrode active material respectively are arranged with a separator interposed therebetween, and a sheath material, that is, a battery case, that seals and accommodates the electrode assembly together with an electrolyte solution.

According to the shape of a sheath material, lithium secondary batteries are classified into can type secondary batteries in which the electrode assembly is embedded in a metal can and pouch type secondary batteries in which the electrode assembly is embedded in an aluminum laminated sheet pouch. Among these, the pouch type secondary battery may be used to constitute a battery module having a module housing accommodating a plurality of secondary batteries and a bus bar assembly configured to electrically connect the plurality of secondary batteries.

In addition, since electrode leads serving as electrode terminals are provided in the form of a thin metal sheet in pouch type secondary batteries, a battery module including pouch type secondary battery cells includes metal plate-shaped bus bars as means for easily and stably connecting the electrode leads. The bus bars may be generally mounted on a bus bar frame in the form of a board in a regular pattern.

In addition, when some secondary batteries are over-voltage, over-current or over-heat, the battery module including the pouch type secondary batteries further includes voltage sensing components such as many wires, a printed circuit board, a connector, etc. to sense and control these.

An assembly process of such a battery module includes a process of stacking the pouch type secondary battery cells to form a cell stack, assembling the bus bar frame and the voltage sensing components to the cell stack, and casing them integrally into a module housing. At this time, while inserting and accommodating the cell stack in the inner space of the module housing, a problem occurs in that the cell stack is damaged due to friction or impact between the cell stack and the module housing.

Moreover, a battery module for an electric vehicle has a small storage space and the minimum assembly tolerance of components so as to increase energy density. As such, when the assembly tolerance of the components of the battery module is small, interference occurs even with a slight position error, which makes assembling difficult and further decreases a production yield. Therefore, there is a need for a method capable of solving the above-described problem within a range that the energy density is not impaired when assembling the battery module.

Furthermore, when a member in which an end of each of internal configurations mounted therein has a sharp shape or the end has a shape bent in the inner direction is applied to the battery module for a vehicle, in the case of a car accident, a problem that such internal configurations are broken and the secondary battery accommodated therein is damaged may occur by the internal configurations.

DISCLOSURE

Technical Problem

The present disclosure is designed to solve the problems of the related art, and therefore the present disclosure is directed to providing a battery module that minimizes damage to internal configurations generated in an assembly process.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a battery module including a cell assembly provided with a plurality of secondary batteries mutually stacked in a left to right direction, each of the plurality of secondary batteries having an electrode lead protruding in a front and back direction; a bus bar assembly provided with a bus bar frame located on a front side or a rear side of the cell assembly is located and having a plate-shaped body portion, and a bus bar mounted on an outer surface of the bus bar frame and having a conductive metal to electrically connect the electrode leads of the plurality of secondary batteries to each other; and an inner cover provided with a plate portion located on an outer side of the cell assembly and formed with a chamfer on an outer peripheral portion and a coupling portion coupled to one end portion of the body portion of the bus bar frame on a part of the outer peripheral portion of the plate portion.

The plate portion may be a rectangular plate, and formed with a chamfer on an end portion of each of a front edge, a back edge, a left edge and a right edge.

The chamfer may be inclined so that a lower edge extends further outwardly than an upper edge.

The battery module may further include a module housing having a tube shape with open sides.

Each of the open ends of the module housing may be formed with a chamfer.

The chamfer may be inclined so that a lower edge extends further outwardly than an upper edge.

A linear protrusion formed on the module housing and protruding in an inner direction and extending long to the open both ends of the module housing may be formed on an inner surface of the module housing.

A guide groove formed in an outer surface of the inner cover and indented in an inner direction such that the linear protrusion is inserted therein.

One end portion of the body portion of the bus bar frame may be provided with a fastening portion coupled to the coupling portion of the inner cover in a hinge coupling structure.

The body portion of the bus bar frame may be provided with a protrusion portion protruding in an inner direction.

The plate portion of the inner cover may be formed with an insertion groove recessed in the inner direction such that the protrusion portion is inserted into one end portion of the plate portion.

The battery module may further include a protection circuit module.

The protection circuit module may be provided with a printed circuit board extending long in a front and back direction and engraved with a wiring pattern; and a voltage sensing terminal formed in both end portions of the printed circuit board in the front and back direction and provided with a wiring to measure a voltage of the secondary battery.

An indentation portion indented inwardly may be provided on an inner lower surface of the plate portion of the inner cover such that at least a part of the printed circuit board is inserted into the indentation portion.

A support plate protruding and extending in an inner direction to support a part of the cell assembly in an upper direction may be provided on a lower end of the body portion of the bus bar frame. The support plate may have an end line in which a width of at least a part of the support plate is gradually reduced toward an inner direction so as to have a sharp center part.

The support plate may have an incline structure in which a thickness of the support plate becomes thinner toward an end in the inner direction.

In another aspect of the present disclosure, there is provided a battery pack including at least one battery module.

In another aspect of the present disclosure, there is provided a vehicle including the battery pack.

Advantageous Effects

According to an aspect of the present disclosure, a battery module of the present disclosure is provided with an inner cover in which a chamfer is formed on the outer peripheral portion, thereby preventing a cell assembly from being damaged by a module housing due to interference or friction in a process of inserting the cell assembly and the inner cover into the module housing.

In addition, according to an aspect of an embodiment of the present disclosure, the battery module of the present disclosure is provided with a coupling portion coupled to a bus bar frame on the inner cover, such that the bus bar frame is easily mounted and fixed to the front end or back end of the cell assembly, thereby increasing the manufacturing efficiency of the battery module.

Moreover, according to an aspect of the present disclosure, the inner cover of the present disclosure in which the chamfer inclined in the lower direction is formed may be inserted more softly and smoothly in a process of being inserted into the module housing, and it is possible to insert the module housing and a cell assembly and the inner cover that are internal configurations to be in close contact with each other by the inner cover. Accordingly, the battery module has an advantage capable of further increasing the heat dissipation efficiency through the module housing.

In addition, according to an aspect of the present disclosure, chamfers on open both end portions of the module housing is formed in the battery module of the present disclosure, thereby minimizing interference occurred in a process of inserting the cell assembly and the inner cover into an inner space of the module housing and easily inserting such that the inner surface of the module housing and the outer surface (the lower surface) of the cell assembly is in close contact.

Furthermore, according to an aspect of the present disclosure, a guide groove configured to enable a linear protrusion formed on the inner surface of the module housing to be inserted and to be movable is formed in the outer surface of the inner cover, the present disclosure may guide a path for inserting and moving the inner cover and the cell assembly inside the module housing. Accordingly, it is possible to shorten the time of a manufacturing process, and minimize the interference between the inner surface of the module housing, the inner cover and the cell assembly due to shaking during an insertion process.

In addition, according to an aspect of the present disclosure, an indention portion indented is formed in the inner direction of the inner cover, and thus the present disclosure may insert and fix a part of a printed circuit board. Accordingly, not only the volume occupied by the printed circuit board may be further reduced, but also the indention portion may guide the printed circuit board to be located on a correct position, thereby shortening the manufacturing time. Moreover, the printed circuit board inserted in the indention portion may reduce a force that the cell assembly presses the printed circuit board in the upper direction.

Furthermore, according to an aspect of the present disclosure, a support plate capable of supporting a part of the lower surface of the cell assembly in the upper direction is provided in the bus bar frame, and thus the present disclosure prevents drooping of the cell assembly and facilitating assembling with the module housing. In addition, the support plate has a sharp edge portion with an end line sharp in the center, and thus the support plate may easily enter into the module housing.

According to an aspect of the present disclosure, an incline structure in which the thickness becomes thinner toward the end in the inner direction on the support plate is formed, when assembling the battery module, and thus an entrance of the module housing may be slightly opened by the incline structure of the support plate.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

MODE FOR DISCLOSURE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Figure 1:
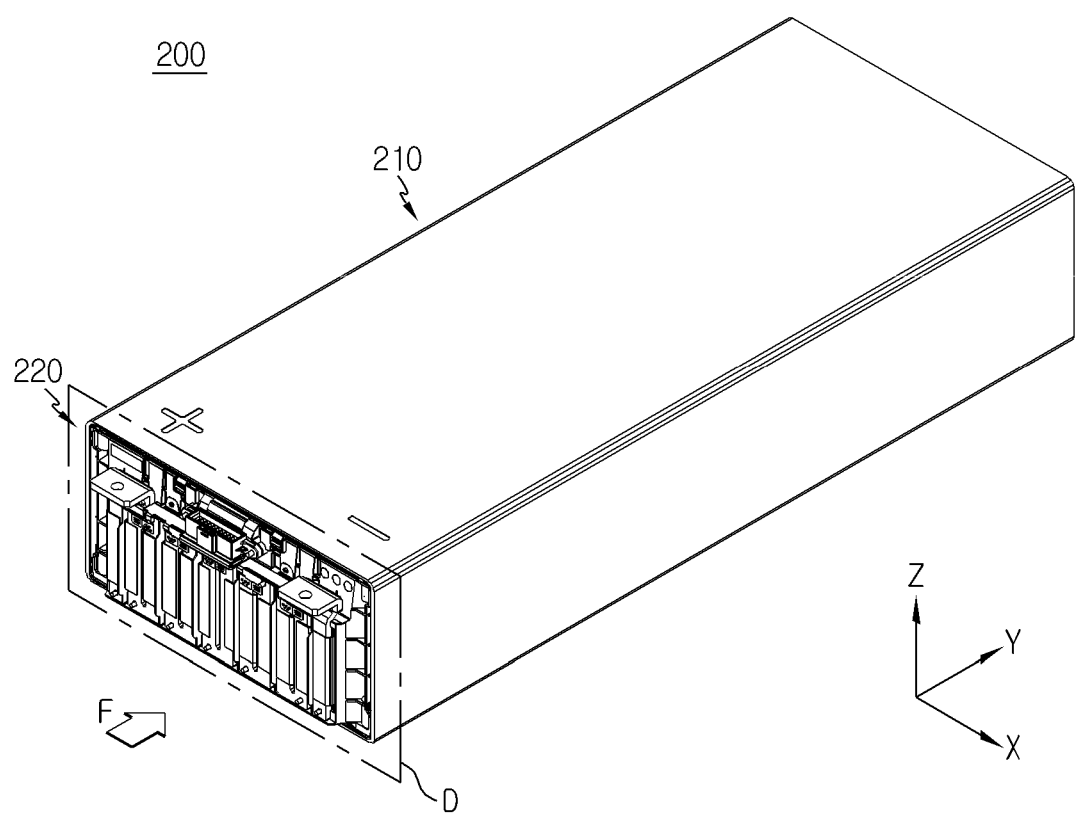
FIG. 1 is a perspective view schematically showing a battery module according to an embodiment of the present disclosure.
Figure 2:
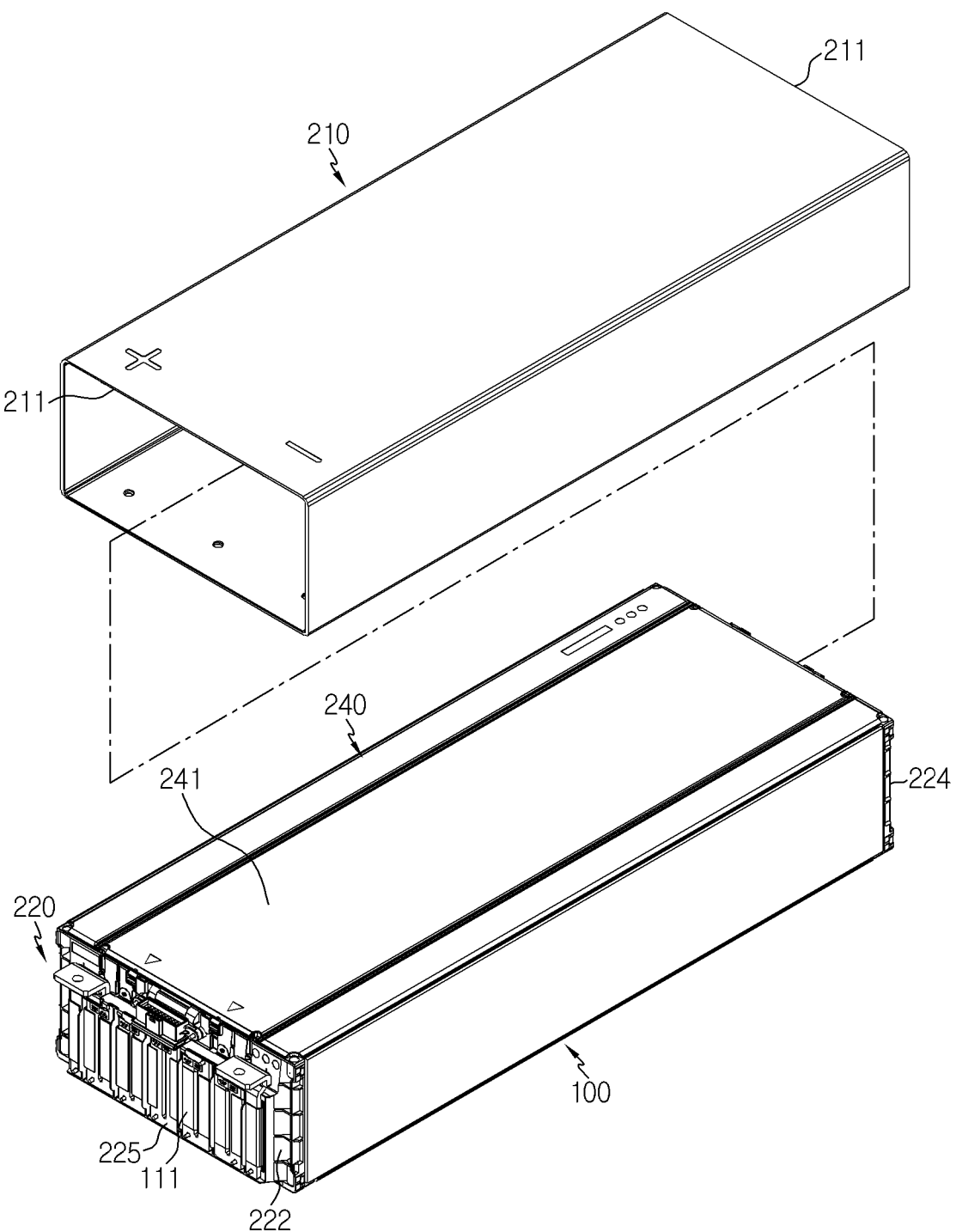
FIG. 2 is an exploded perspective view schematically showing a module housing that is a partial configuration of a battery module according to an embodiment of the present disclosure.
Figure 3:
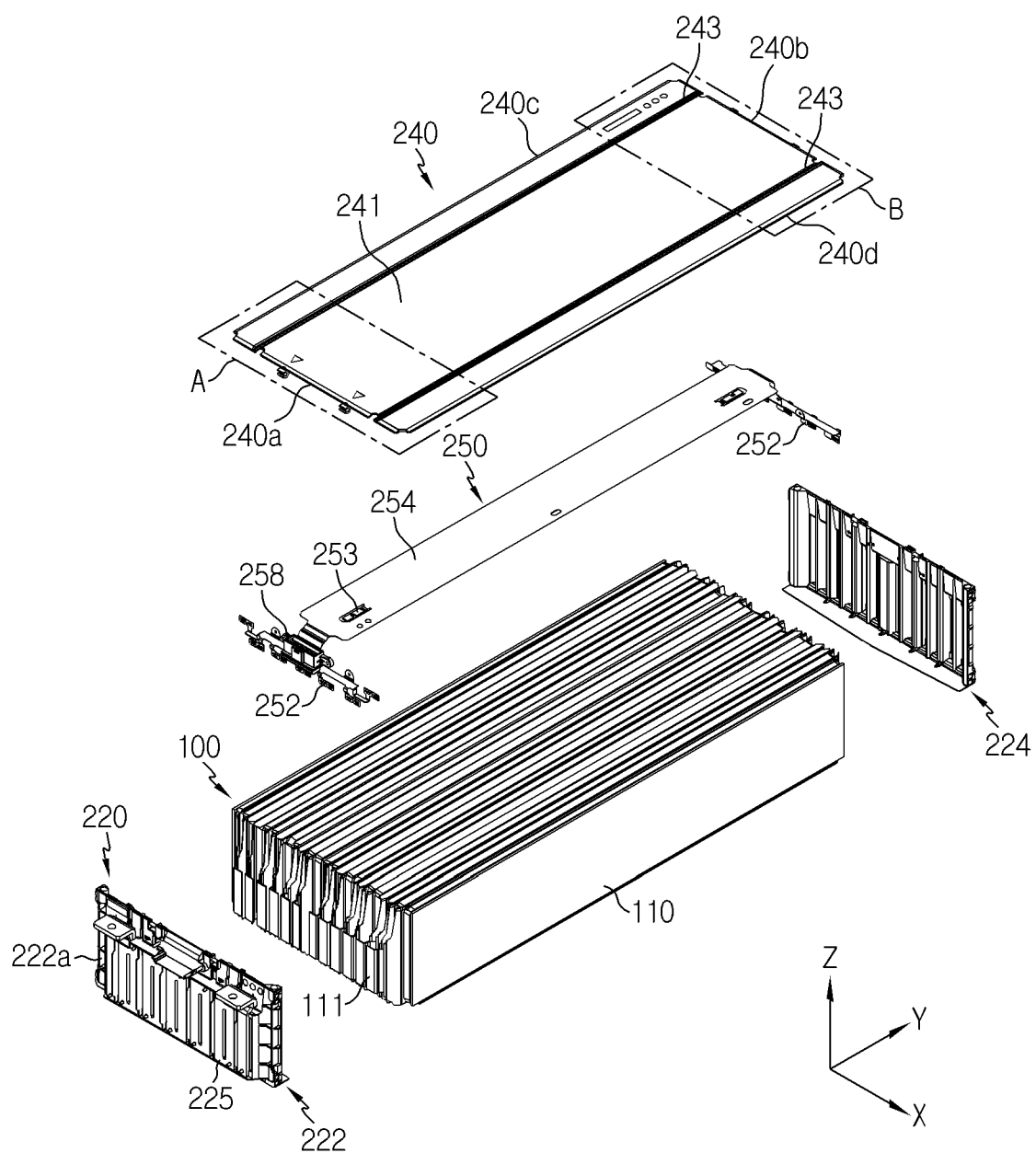
FIG. 3 is an exploded perspective view schematically showing some separated configurations of a battery module according to an embodiment of the present disclosure.
Figure 4:
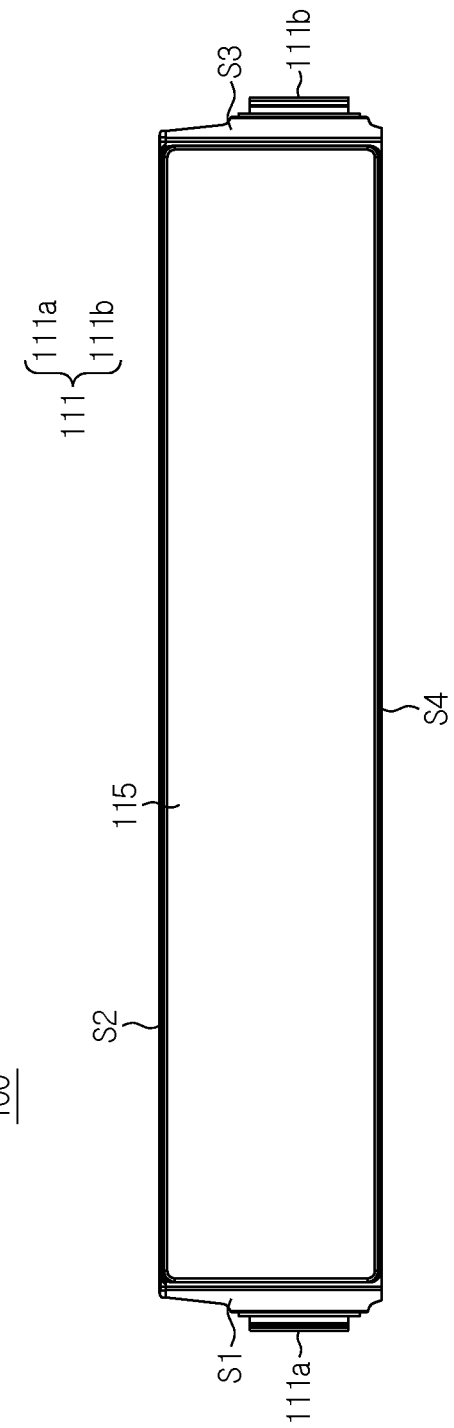
FIG. 4 is a lateral view schematically showing a secondary battery that is a partial configuration of a battery module according to an embodiment of the present disclosure.

FIG. 1 is a perspective view schematically showing a battery module according to an embodiment of the present disclosure. FIG. 2 is an exploded perspective view schematically showing a module housing that is a partial configuration of the battery module according to an embodiment of the present disclosure. FIG. 3 is an exploded perspective view schematically showing some separated configurations of the battery module according to an embodiment of the present disclosure. FIG. 4 is a lateral view schematically showing a secondary battery that is a partial configuration of the battery module according to an embodiment of the present disclosure.

Referring to FIGS. 1 to 4, a battery module 200 according to an embodiment of the present disclosure may include a cell assembly 100, a bus bar assembly 220, an inner cover 240, and a module housing 210.

Here, the cell assembly 100 may include a plurality of secondary batteries 110.

In this regard, the secondary battery 110 may be a pouch type secondary battery 110. In particular, the pouch type secondary battery 110 may be provided with an electrode assembly (not shown), an electrolyte (not shown), and a pouch sheath material 115.

Here, the electrode assembly may be configured such that one or more positive electrode plates and one or more negative electrode plates are disposed with a separator interposed therebetween. More specifically, the electrode assembly may be divided into a winding type in which one positive electrode plate and one negative electrode plate are wound together with a separator, and a stack type in which multiple positive electrode plates and multiple negative electrode plates are alternately stacked with a separator therebetween.

In addition, the pouch sheath material 115 may be configured to have an external insulating layer, a metal layer, and an internal adhesive layer. The pouch sheath material 115 may be configured to include a metal thin film, such as an aluminum thin film, in order to protect internal elements such as the electrode assembly and the electrolyte, compensate for electrochemical properties by the electrode assembly and the electrolyte, and improve heat dissipation. The aluminum thin film may be interposed between insulating layers formed of an insulating material to ensure electrical insulation between elements inside the secondary battery 110, such as the electrode assembly and the electrolyte or other elements outside the secondary battery 110.

In particular, the pouch sheath material 115 may include two pouches and an inner space in a concave shape may be formed in at least one of the two pouches. In addition, the electrode assembly may be accommodated in the inner space of the pouch. Furthermore, sealing portions S1, S2, S3, and S4 are provided on the outer peripheral surfaces of the two pouches such that the sealing portions S1, S2, S3, and S4 of these pouches are fused to each other, and thus the inner space in which the electrode assembly is accommodated may be sealed.

Each pouch type secondary battery 110 may be provided with an electrode lead 111 formed in a shape protruding in the front and back direction, and the electrode lead 111 may include a positive electrode lead 111a and a negative electrode lead 111b.

More specifically, the electrode lead 111 may be configured to protrude forward or backward from each of the sealing portions S1 and S3 located on the front or back outer peripheral portion of the pouch sheath material 115. Further, the electrode lead 111 may function as an electrode terminal of the secondary battery 110.

For example, as illustrated in FIG. 4, the one electrode lead 111a may be configured to protrude forward from the secondary battery 110, and the other electrode lead 111b may be configured to protrude backward from the secondary battery 110.

Therefore, according to this configuration of the present disclosure, in the one secondary battery 110, there is no interference between the positive electrode lead 111a and the negative electrode lead 111b, and thus the area of the electrode lead 111 may be increased, and a welding process between the lead 111 and a bus bar 225 may be performed more easily.

In addition, a plurality of pouch type secondary batteries 110 may be included in the battery module 200 and arranged to be stacked in at least one direction. For example, as illustrated in FIG. 4, the plurality of pouch type secondary batteries 110 may be configured in a mutually stacked form side by side in the left and right direction. At this time, each pouch type secondary battery 110 may be approximately disposed to be vertically erected on the ground such that two broad surfaces are respectively located on the left and right sides, and the sealing portions S1, S2, S3, and S4 are respectively located in the upper, lower, front, and back portions. In other words, each secondary battery 110 may be configured in an erected form in the upper and lower directions.

The configuration of the pouch type secondary battery 110 described above is a matter obvious to those skilled in the art to which the present disclosure pertains, and thus a detailed description thereof will be omitted. In the cell assembly 100 according to the present disclosure, various secondary batteries 110 known at the time of filing of the present disclosure may be employed.

Meanwhile, referring to FIGS. 1 and 3 again, the bus bar assembly 220 may be provided with a bus bar frame 222 and the bus bar 225 mounted on the outer surface of the bus bar frame 222.

Specifically, when viewed in the F direction, the bus bar frame 222 may be located in the front or back where the electrode lead 111 of the cell assembly 100 is formed. Meanwhile, the terms indicating directions such as front, back, left, right, up and down described herein may vary depending on the position of an observer or the form in which an object is placed. However, in the present specification, for convenience of description, the directions of front, back, left, right, up, and down are identified and shown with respect to when viewed in the F direction.

In addition, the bus bar frame 222 may have a plate-shaped body portion 222a. Moreover, the body portion 222a may be formed to stand upright in the upper and lower direction with respect to the ground. In addition, the body portion 222a may have a size to cover the front end surface of the cell assembly 100. Furthermore, the bus bar frame 222 may include an electrically insulating material. For example, the electrically insulating material may be plastic.

For example, as illustrated in FIG. 2, the bus bar assembly 220 may be provided with two bus bar frames 222 and 224 located at the front and rear respectively where the electrode leads 111 of the cell assembly 100 are formed.

In addition, the bus bar assembly 220 may be provided with the bus bar 225 having a conductive metal to electrically connect the electrode leads 111 of the plurality of pouch type secondary batteries 110. For example, the conductive metal may be copper, copper alloy, aluminum, aluminum alloy, or nickel. In addition, the bus bar 225 may be mounted on the outer surface of the bus bar frame 222.

Specifically, the bus bar 225 may be mounted on and fixed to the outer surface of the bus bar frame 222. Also, a plurality of bus bars 225 may be disposed side by side in the left and right directions and mounted on the outer surface of the bus bar frame 222. Furthermore, the plurality of bus bars 225 may have different electrical polarities according to the position of the bus bar frame 222.

Moreover, a through hole H1 may be formed in the bus bar frame 222 such that at least one electrode lead 111 penetrates and protrudes thereinto. Specifically, the end portions of the plurality of electrode leads 111 may be configured to protrude in the front and back direction from the secondary battery 110 and penetrate the through hole H1 of the bus bar frame 222. Accordingly, the through hole H1 may be formed to have the position and the size that are easy for the end portion of the electrode lead 111 inserted into and penetrating the bus bar frame 222 to be in contact with and connected to the body of the bus bar 225. For example, as shown in FIG. 3, a total of 24 secondary batteries 110 may be electrically connected in parallel in a bundle of two in the battery module 200 of the present disclosure. Also, 12 bundles of secondary batteries 110 may be connected in series through the plurality of bus bars 225.

Figure 5:
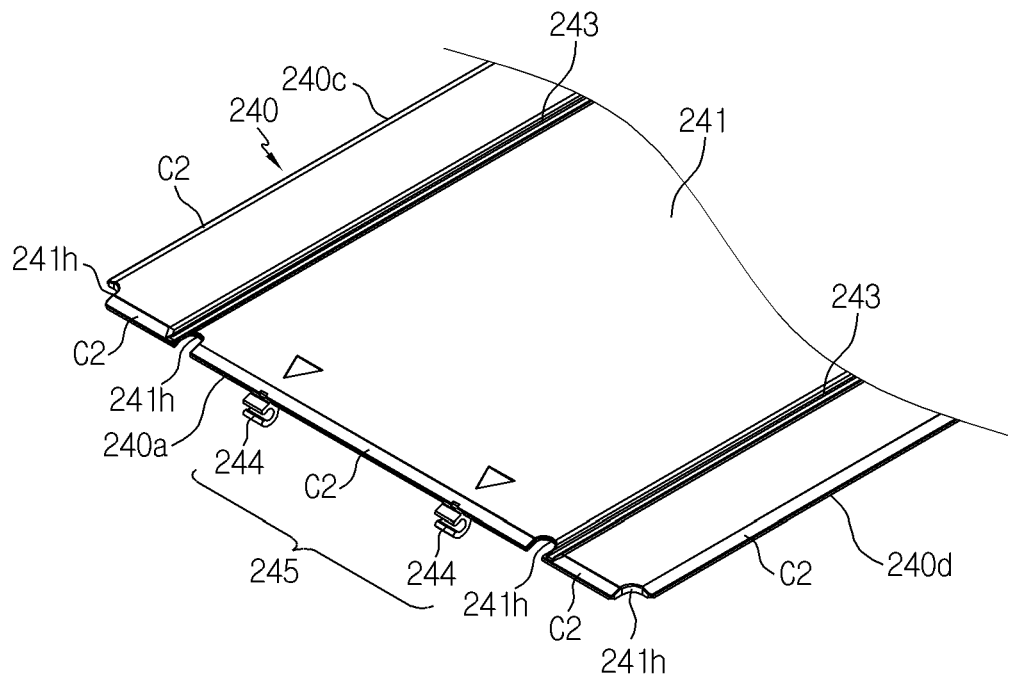
FIG. 5 is an enlarged perspective view schematically showing a region A of an inner cover of FIG. 3.
Figure 6:
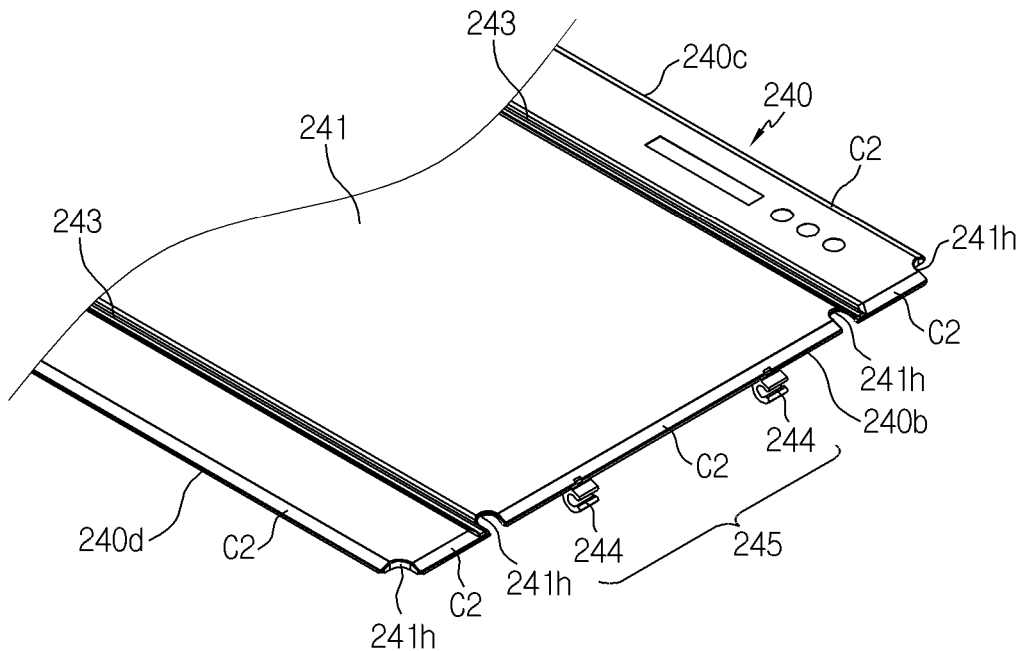
FIG. 6 is an enlarged rear perspective view schematically showing a region B of the inner cover of FIG. 3.

FIG. 5 is an enlarged perspective view schematically showing a region A of an inner cover of FIG. 3. FIG. 6 is an enlarged rear perspective view schematically showing a region B of the inner cover of FIG. 3.

Referring to FIGS. 5 and 6, the inner cover 240 may be located outside the cell assembly 100. For example, as illustrated in FIG. 2, the inner cover 240 may be located on the upper side of the cell assembly 100. In addition, the inner cover 240 may be provided with a plate portion 241.

Specifically, the plate portion 241 may be formed in a plate shape extending in parallel to the ground. In other words, the plate portion 241 may have a shape of a rectangular plate portion having flat upper and lower surfaces and in a lying form. Moreover, the plate portion is a rectangular plate in a flat form, and a chamfer C2 (first chamfer) may be formed on the end portion of each of the front, rear, left and right directions. That is, the plate portion 241 may be formed with the chamfer C2 on the outer peripheral portion in the horizontal direction. The chamfer C2 may be formed by chamfering a corner of the end portion of the plate portion 241 in the horizontal direction. For example, as shown in FIGS. 3, 5, and 6, the plate portion 241 may be formed with the chamfer C2 on the end surface of the horizontal direction of the end portion of each of the front, rear, left, and right directions.

Therefore, according to this configuration of the present disclosure, the battery module 200 of the present disclosure is provided with the inner cover 240 in which the chamfer C2 is formed on the outer peripheral portion, as shown in FIG. 2, thereby preventing the cell assembly 100 from being damaged by the module housing 210 in a process of inserting the cell assembly 100 and the inner cover 240 into the module housing 210.

Moreover, the chamfer C2 on the end surface of the outer peripheral portion may be formed on the inner cover 240, thereby preventing collision or interference with the inner surface of the module housing 210 from occurring in the process of inserting the inner cover 240 into the module housing 210. Thus, there is an advantage of shortening the manufacturing time of the battery module 200 and increasing the manufacturing efficiency.

Meanwhile, the inner cover 240 may be provided with the coupling portion 245 coupled to one end portion of the bus bar frame 222. Specifically, the coupling portion 245 may be formed on a part of the outer peripheral portion of the plate portion 241 in the horizontal direction. For example, as illustrated in FIG. 3, the coupling portion 245 may be formed on each of a front end portion 240a and a rear end portion 240b of the plate portion 241. In addition, the coupling portion 245 may be coupled to the upper end portion of the body portion 222a of the bus bar frame 222.

Therefore, according to this configuration of the present disclosure, the present disclosure is provided with the coupling portion 245 coupled to the bus bar frame 222 on the inner cover 240, and thus there is an advantage that the bus bar frame 222 is easily mounted on and fixed to the front end or rear end of the cell assembly 100, thereby increasing the manufacturing efficiency of the battery module 200.

Referring back to FIGS. 5 and 6, when the inner cover 240 is located on the upper portion of the cell assembly 100, the chamfer C2 may have a structure inclined in the lower direction toward the outer side (the end portion). To the contrary, when the inner cover 240 is position on the lower portion of the cell assembly 100, the chamfer C2 may have a structure inclined in the upper direction toward the outer side (the end portion). Here, the 'inner direction' refers to a direction in which the cell assembly 100 is located with respect to the inner cover 240.

In other words, the chamfer C2 may have a structure inclined in a direction in which the cell assembly 100 is located toward the outer side. In addition, the chamfer C2 may be a structure in which the thickness in the upper and lower direction gradually becomes thinner as the outer peripheral portion of the plate portion 241 is closer toward the end face of the plate portion 241. Moreover, when the inner cover 240 is located on the upper portion of the cell assembly 100, the chamfer C2 may be gradually lowered as the position of the upper side of the plate portion 241 is closer toward the end portion of the plate portion 241.

For example, as in FIGS. 5 and 6, the plate portion 241 may be a rectangular plate in a lying form, may be formed with the chamfer C2 on the end surface of each of the end portions 240a, 240b, 240c, and 240d of the front, rear, left, and right directions, and may have a structure inclined in the lower direction toward the end portion of the plate portion 241.

Accordingly, according to this configuration of the present disclosure, the inner cover 240 in which the chamfer C2 inclined in the lower direction is formed may be inserted more softly and smoothly in a process of being inserted into the module housing 210. Furthermore, it may be possible to insert the cell assembly 100 which is an internal configuration and the inner cover 240 to be in close contact with the module housing 210 by the inner cover 240. Accordingly, since the inner surface of the module housing 210 and the outer surface of the cell assembly 100 may be in close contact, there is an advantage of further increasing the heat dissipation efficiency through the module housing 210. Furthermore, when the battery module is applied as a battery module for an automobile, compared to the related art to which a member in which an end of internal configurations mounted therein has a sharp shape or the end has a shape bent in the inner direction is applied, in the event of a car accident, even if the inner cover is broken, corners are not sharp, and thus the present disclosure may prevent a secondary battery accommodated therein from being secondarily damaged.

Figure 7:
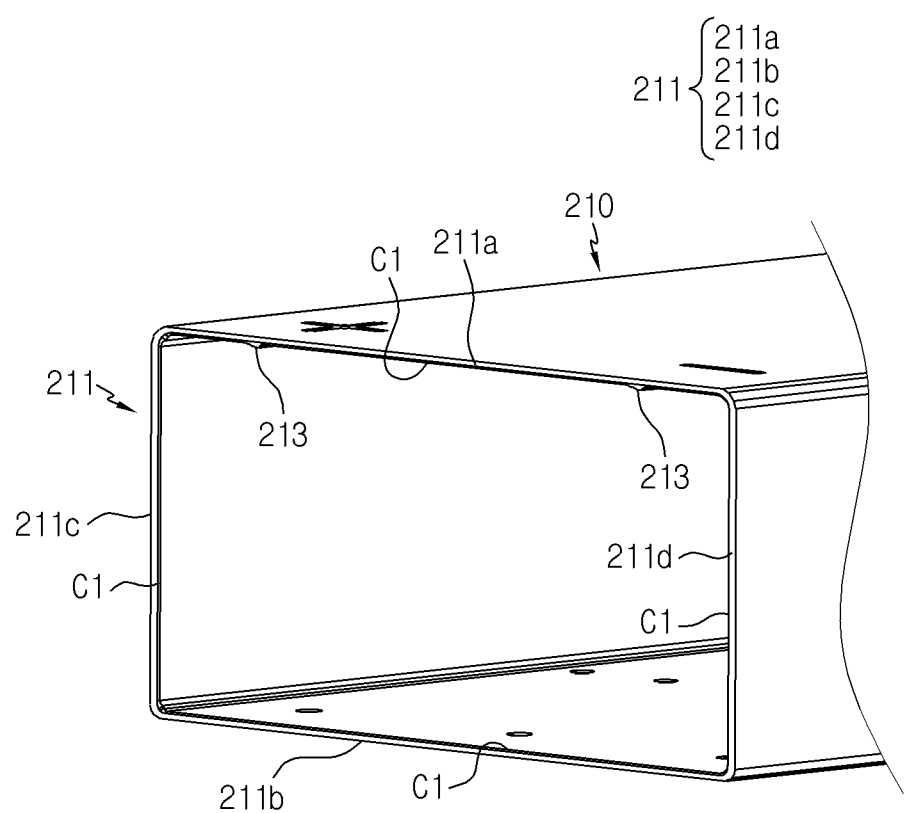
FIG. 7 is a perspective view schematically showing a module housing which is a partial configuration of a battery module according to an embodiment of the present disclosure.

FIG. 7 is a perspective view schematically showing a module housing which is a partial configuration of a battery module according to an embodiment of the present disclosure.

Referring to FIG. 7 together with FIG. 2, the battery module 200 may further include the module housing 210 having a tubular shape with open both sides. Specifically, the module housing 210 may be a rectangular tube-shaped mono frame formed by a top wall, a bottom wall and sidewalls, a first open end and a second open end. The open ends have a chamfer C1 (second chamfer) formed in the top wall. In addition, the module housing 210 may be configured to accommodate a part of the inner side of the cell assembly 100 and the bus bar frame 222 in an inner space. For example, as illustrated in FIG. 2, the module housing 210 may have a rectangular tubular shape opened in the front and back direction.

Meanwhile, in the related art, in order to smoothly accommodate the cell assembly 100 inside the module housing 210 in a forcible fitting manner, when an error occurs in that the dimension of each component exceeds an allowable error range, it was difficult to smoothly assemble the two configurations.

Therefore, according to this configuration of the present disclosure, the battery module 200 of the present disclosure is provided with the module housing 210 having an inner space capable of accommodating the cell assembly 100 therein in the forcible fitting manner, such that the inner surface of the module housing 210 and the outer surface of the cell assembly 100 may be in close contact, and thus there is an advantage of further increasing the heat dissipation efficiency through the module housing 210.

Referring to FIG. 7 together with FIG. 2, a chamfer C1 may be formed on open both end portions 211 of the module housing 210. Specifically, the chamfer C1 may have a structure inclined in the outer direction with respect to the center of both ends toward the both end portions 211. In addition, the chamfer C1 may be formed adjacent to the inside of the open both end portions 211 of the module housing 210. For example, the chamfer C1 may have a structure in which the thicknesses of the open both end portions 211 of the module housing 210 become thinner toward the end. In addition, the chamfer C1 may have a structure in which the position of the inner surface of the end portion of the module housing 210 gradually rises toward the both end portions 211. For example, as illustrated in FIG. 7, the chamfer C1 may be formed on each of the upper end portion 211a, the side end portions 211c and 211d, and the lower end portion 211b of the open both end portions 211 of the module housing 210. Specifically, the chamfer C1 formed on the upper end portion 211a of the open end portion 211 of the module housing 210 may have a structure inclined in the upper direction toward the end portion. To the contrary, the chamfer C1 formed on the lower end portion 211b of the open end portion 211 may have a structure inclined in the lower direction toward the outer side. Further, the chamfer C1 of the side end portions 211c and 211d of the open end portion 211 may have a structure inclined in the left direction or in the right direction (outer side) in which the cell assembly 100 is located.

Accordingly, by forming the chamfer C1 on the open both end portions 211 of the module housing 210, the present disclosure may not only minimize interference occurred in a process of inserting the cell assembly 100 and the inner cover 240 into the inner space but also easily insert such that the inner surface of the module housing 210 and the outer surface of the cell assembly 100 is in close contact.

Referring to FIG. 7 together with FIG. 2, a linear protrusion 213 protruding in the inner direction may be formed on the inner surface of the module housing 210. Specifically, the linear protrusion 213 may have a shape that protrudes in the lower direction in which the cell assembly 100 is located and elongates to the open both sides of the module housing 210. For example, as illustrated in FIG. 7, two linear protrusions 213 may be formed in an elongated shape to connect between the open one end portion 211a and the other end portion (not shown) of the module housing 210.

Here, the 'inner direction' refers to a direction in which the cell assembly 100 is located with respect to the module housing 210.

In addition, the linear protrusion 213 may have a shape that protrudes in the lower direction and have the thickness in the horizontal direction gradually decreasing toward the lower direction. That is, the lateral cross-section of the linear protrusion 213 may have a sharp horn shape.

Meanwhile, referring to FIGS. 2, 5 and 6 again, a guide groove 243 into which the linear protrusion 213 is inserted and indented concavely to be movable may be formed in the outer surface of the plate portion 241 of the inner cover 240. Specifically, the guide groove may have a shape indented in the inner direction in the outer surface of the plate portion 241 of the inner cover 240.

Here, the 'inner direction' refers to a direction in which the cell assembly 100 is located with respect to the inner cover 240.

In addition, the guide groove 243 may have a shape that elongates to open both sides of the module housing 210. For example, as shown in FIG. 2, two guide grooves 243 may be formed in the outer surface of the plate portion 241 of the inner cover 240 to extend from the front end portion 240a of the plate portion 241 to the rear end portion 240b.

Therefore, according to this configuration of the present disclosure, the guide groove 243 configured to enable the linear protrusion 213 formed on the inner surface of the module housing 210 to be inserted and movable is formed in the outer side of the inner cover 240, the present disclosure may guide a path for inserting and moving the inner cover 240 and the cell assembly 100 inside the module housing 210. Accordingly, it is possible to shorten the time of the manufacturing process and minimize the interference between the inner surface of the module housing 210 and the inner cover 240 and the cell assembly 100 due to shaking during an insertion process.

Figure 8:
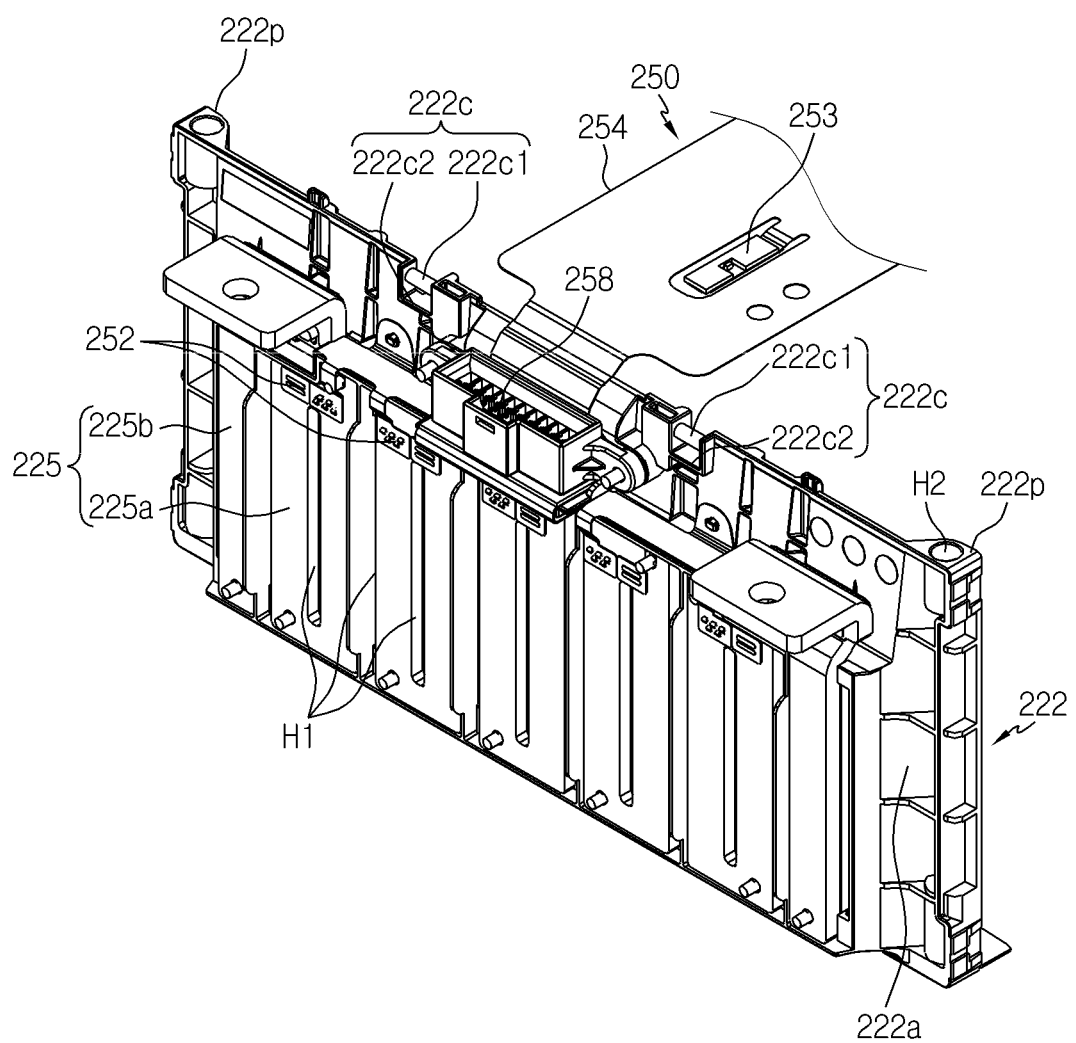
FIG. 8 is a perspective view schematically showing some components of a battery module according to an embodiment of the present disclosure.
Figure 9:
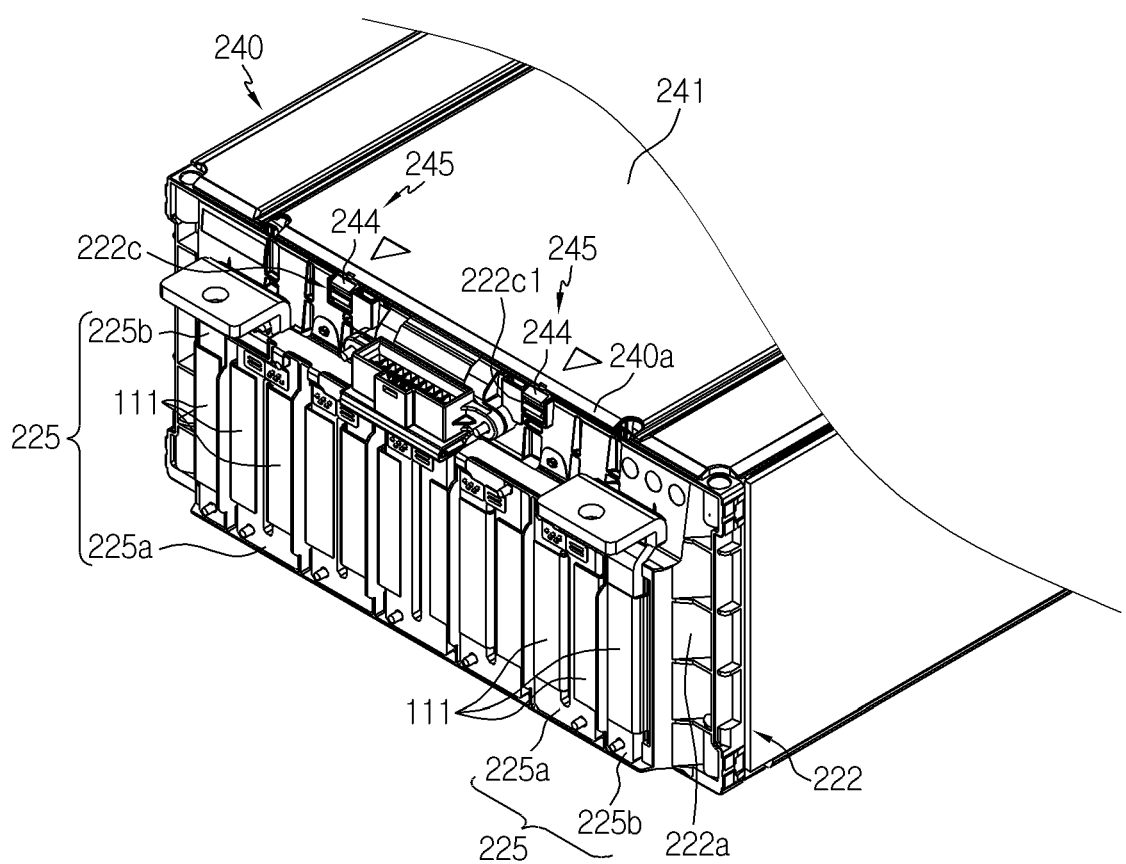
FIG. 9 is an enlarged perspective view schematically showing a region D of the battery module of FIG. 1.
Figure 10:
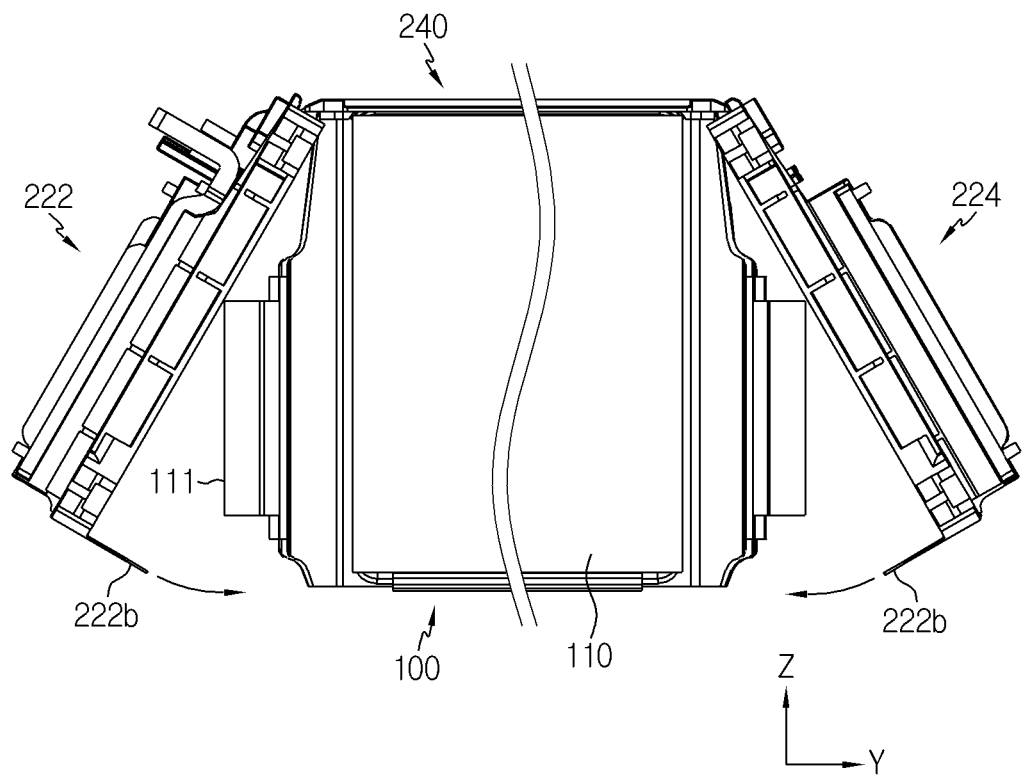
FIG. 10 is a lateral view schematically showing a process of assembling some components of a battery module according to an embodiment of the present disclosure.

FIG. 8 is a perspective view schematically showing some components of a battery module according to an embodiment of the present disclosure. FIG. 9 is an enlarged perspective view schematically showing a region D of the battery module of FIG. 1. FIG. 10 is a lateral view schematically showing a process of assembling some components of a battery module according to an embodiment of the present disclosure.

Referring to FIGS. 8 to 10, a fastening portion 222c coupled to the coupling portion 245 of the inner cover 240 in a hinge coupling structure may be provided on one end portion of the body portion 222a of the bus bar frame 222. Specifically, a C-shaped hook 244 may be provided on the coupling portion 245 of the inner cover 240 such that the end portion (the upper end portion) of the bus bar frame 222 is rotatable. The fastening portion 222c of the bus bar frame 222 may be provided with a fixture 222c1 having a part inserted into the C-shaped hook 244. However, this is only an example, and any forms in which the coupling portion 245 of the inner cover 240 and the fastening portion 222c of the bus bar frame 222 are coupled in the hinge coupling structure is applicable.

For example, as illustrated in FIG. 9, two C-shaped hooks 244 may be spaced apart from each other by a predetermined distance on the front end portion 240a of the inner cover 240. In addition, the C-shaped hook 244 may have a shape protruding and extending from the front end portion 240a of the plate portion 241 in the lower direction. That is, the C-shaped hook 244 may be located on the lower portion (the inner side) of the front end portion 240a of the plate portion 241. In addition, as illustrated in FIGS. 5 and 6, two C-shaped hooks 244 may be formed on each of the front end portion 240a and the rear end portion 240b of the inner cover 240.

In addition, the fixture 222c1 may be formed on the upper end portion of the body portion 222a of the bus bar frame 222. More specifically, an indentation groove 222c2 indented in the lower direction may be formed in the upper end portion of the bus bar frame 222. In addition, the fixture 222c1 extending from the inner left surface to the inner right surface may be formed inside the indentation groove 222c2. Furthermore, the fixture 222c1 may have a cylindrical shape extending in the left and right direction.

For example, as shown in FIG. 8, two indentation grooves 222c2 and the fixture 222c1 formed inside each of the two indentation grooves 222c2 may be formed in the upper end portion of the body portion 222a of the bus bar frame 222. In addition, as illustrated in FIG. 9, the two C-shaped hooks 244 of the inner cover 240 may be hinge coupled to the two fixtures 222c1.

Referring back to FIG. 8, the body portion 222a of the bus bar frame 222 may be provided with a protrusion portion 222p in a shape protruding in the inner direction. Specifically, the protrusion portion 222p may have a shape protruding in a direction in which the cell assembly 100 is located. In addition, for example, a fitting groove H2 may be formed in the protrusion portion 222p such that a welding fixing jig (not shown) may be inserted. For example, as illustrated in FIG. 8, the protrusion portion 222p protruding in the inner direction in which the cell assembly 100 is located may be formed on each of both end portions of the body portion 222a of the bus bar frame 222 in the left and right direction. In addition, the fitting groove H2 into which the welding fixing jig is inserted may be formed in each of the two protrusion portions 222p.

In addition, referring to FIGS. 5 and 6 again, an insertion groove 241h indented in the inner direction of the body may be formed in the front end portion 240a and the rear end portion 240b of the inner cover 240. Specifically, the insertion groove 241h may have a shape indented in the inner direction of the body such that the protrusion portion 222p is inserted into one end portion coupled to the bus bar frame 222.

More specifically, the insertion groove 241h may be formed at the edge of each of the front end portion 240a and the rear end portion 240b of the plate portion 241 of the inner cover 240 in the right and left direction. For example, as illustrated in FIG. 6, four insertion grooves 241h may be formed at the front end portion 240a of the plate portion 241 of the inner cover 240. Two of the four insertion grooves 241h may be positioned closer to the center in the left and right direction of the front end portion 240a of the plate portion 241 relative to the remaining insertion grooves 241h. Furthermore, the remaining two insertion grooves 241h may be formed at each of both side edges of the front end portion 240a of the plate portion 241 of the inner cover 240 in the left and right direction.

In addition, for example, as illustrated in FIG. 6, four insertion grooves 241h may be formed in the rear end portion 240b of the plate portion 241 of the inner cover 240. Two of the four insertion grooves 241h may be formed close to the center in the left and right direction of the rear end portion 240b of the plate portion 241 relative to the remaining insertion grooves 241h. Furthermore, the remaining two insertion grooves 241h may be formed in each of both side edges of the rear end portion 240b of the plate portion 241 of the inner cover 240 in the left and right direction.

Meanwhile, referring to FIGS. 8 and 9 together with FIGS. 1 and 3 again, the battery module 200 according to an embodiment of the present disclosure may further include a protection circuit module 250. Specifically, the protection circuit module 250 may be provided with a printed circuit board 254 engraved with a conductor pattern, a temperature sensing unit 253, a connector 258, and a voltage sensing terminal 252.

More specifically, the printed circuit board 254 may be located on the upper side or the lower side of the cell assembly 100. Moreover, when viewed in the F direction of FIG. 1, the printed circuit board 254 may have a shape elongating in the front and back direction. For example, as shown in FIG. 3, the printed circuit board 254 is located to contact the upper surface of the cell assembly 100. The printed circuit board 254 may have a shape elongating in the front and back direction such that both end portions of the printed circuit board 254 in the front and back direction protrude toward the outer side of the cell assembly 100. Furthermore, the printed circuit board 254 may be implemented as, for example, a flexible printed circuit board.

In addition, the voltage sensing terminal 252 may be formed on both end portions in the front and back direction of the printed circuit board 254. Moreover, the voltage sensing terminal 252 may be provided with a conducting wire to measure the voltage of the secondary battery 110. The conducting wire of the voltage sensing terminal 252 may be bonded to the bus bar 225 to be electrically connected to the bus bar 225.

For example, as illustrated in FIG. 8, a plurality of voltage sensing terminals 252 may be bonded to each of the plurality of bus bars 225 mounted on the outer side of the bus bar frame 222. The voltage sensing terminal 252 may sense voltage values of two secondary batteries electrically connected in parallel in each bus bar 225.

Furthermore, the bus bar 225 connected to the plurality of secondary batteries 110 electrically connected in parallel may be regarded as one node. In addition, the voltage sensing terminal 252 contacting the bus bar 225 may be configured to sense the node voltage of the cell assembly 100. Moreover, voltage data sensed through the voltage sensing terminal 252 may be transmitted to a battery management system (BMS) through a printed circuit board 254 and a connector 258. Here, the BMS (not shown) may control charging and discharging of the plurality of secondary batteries 110 based on the collected voltage data.

Figure 11:
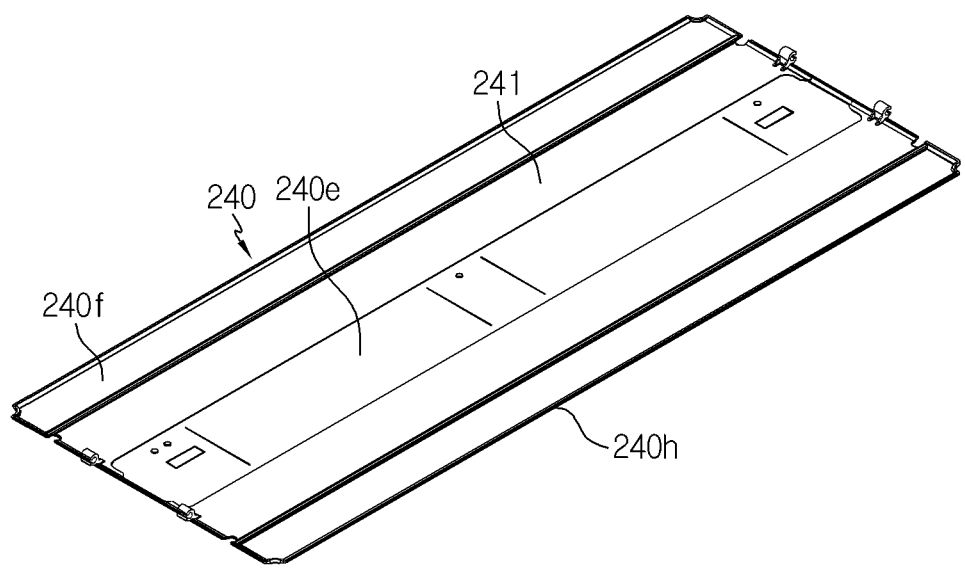
FIG. 11 is a bottom view schematically showing an inner cover which is a partial configuration of a battery module according to an embodiment of the present disclosure.

FIG. 11 is a bottom view schematically showing an inner cover which is a partial configuration of a battery module according to an embodiment of the present disclosure.

Referring to FIG. 11 together with FIG. 3, an indentation portion 240e indented in the inner direction may be provided in an inner lower surface 240f of the plate portion 241 of the inner cover 240 such that at least a part of the printed circuit board 254 is inserted. Specifically, the indentation portion 240e may have a shape elongating from the front end portion 240a of the inner surface 240f of the plate portion 241 to the rear end portion 240b. In addition, the indentation portion 240e may have a size corresponding to a part of the printed circuit board 254.

For example, as illustrated in FIG. 11, a part excluding an outer peripheral portion 240h of the inner surface 240f of the plate portion 241 may have a shape indented in the inner direction of the plate portion 241 rather than the outer peripheral portion 240h. In addition, the indentation portion 240e elongating in the front and back direction and indented in the inner direction relative to the inner surface 240f may be formed in the center part of the inner surface 240f of the plate portion 241.

Therefore, according to this configuration of the present disclosure, the indentation portion 240e indented to the inside of the inner surface 240f of the inner cover 240 is formed, and thus a part of the printed circuit board 254 may be inserted and fixed. Accordingly, not only can the volume occupied by the printed circuit board 254 may be reduced more, but also the indentation portion 240e may be guided to be positioned at the correct position, thereby shortening the manufacturing time. Moreover, the printed circuit board 254 inserted into the indentation portion 240e may reduce the force that the cell assembly 100 presses the printed circuit board 254 in the upper direction.

Figure 12:
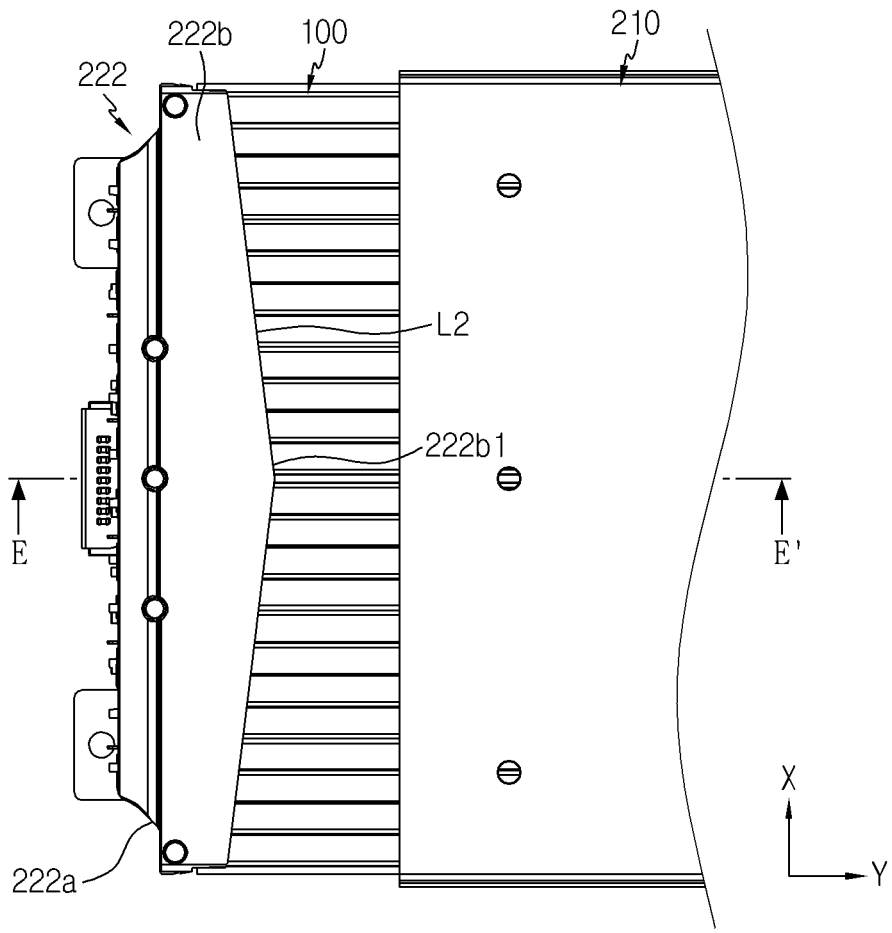
FIG. 12 is a bottom view schematically showing a battery module and a separated module housing according to an embodiment of the present disclosure.
Figure 13:
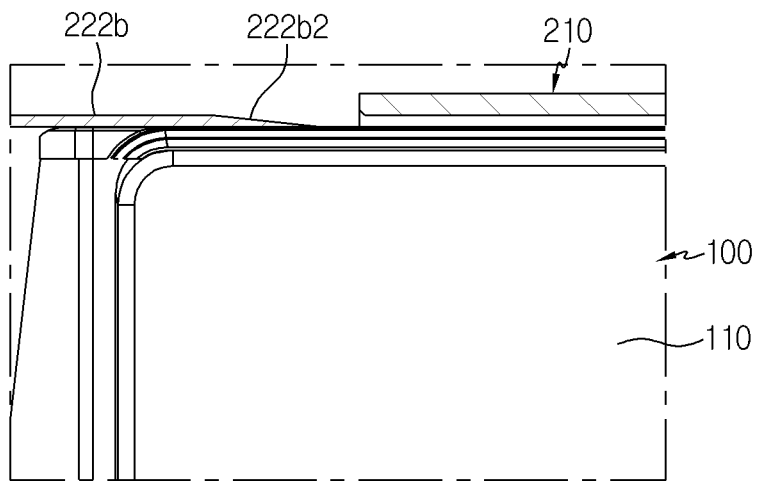
FIG. 13 is a partial lateral cross-sectional view schematically showing a part of a side surface cut along the line E-E' of the battery module of FIG. 12.

FIG. 12 is a bottom view schematically showing a battery module and a separated module housing according to an embodiment of the present disclosure. FIG. 13 is a partial lateral cross-sectional view schematically showing a part of a side surface cut along the line E-E' of the battery module of FIG. 12.

Referring to FIGS. 12 and 13 together with FIG. 3, the bus bar frame 222 may be provided with a support plate 222b supporting a part of the cell assembly 100 in the upper direction. Specifically, the support plate 222b may have a shape protruding and extending in the inner direction.

Here, the 'inner direction' refers to a direction toward the center of the cell assembly 100 with respect to the bus bar frame 222.

The support plate 222b may have a shape protruding and extending from the lower end of the body portion 222a in a direction in which the center of the front and back direction is located. In addition, the width of the support plate 222b in the left and right direction (X direction) may have a size corresponding to the width of the cell assembly 100 in the left and right direction (X direction). That is, the support plate 222b may be disposed below the lower surface of the cell assembly 100 to support the lower surfaces of both ends of the cell assembly 100 in the front and back direction (Y direction) in the upper direction (Z direction in FIG. 1).

Here, the cell assembly 100 may be transported in a state where the cell assembly 100 is assembled with the bus bar assembly 220 to proceed with a subsequent assembly process. In this process, a plurality of secondary batteries 110 may be drooped down. Further, while the cell assembly 100 assembled with the bus bar assembly 220 is inserted into the module housing 210, if some of the plurality of secondary batteries 110 are drooped down, the corresponding secondary batteries may interfere with the entrance of the module housing 210, and thus assembling with the module housing 210 may be difficult.

Therefore, the support plate 222b capable of supporting a part of the lower surface of the cell assembly 100 in the upper direction is provided on the bus bar frame 222, and thus the present disclosure may prevent drooping of the cell assembly 100 and facilitate assembling with the module housing 210.

In particular, in the present disclosure, the support plate 222b may have an end line L2 with a sharp center part since the width of the cell assembly 100 in the left and back direction (X-axis direction) is reduced.

For example, the support plate 222b may be manufactured in a form in which two diagonal lines are gathered such that the center of the end line L2 is not straight but is sharp. Hereinafter, the center part protruding in the back direction of the support plate 222b is defined as a sharp edge portion 222b1. This is to reduce the frictional force between the support plate 222b and the module housing 210 when the battery module 200 is assembled and more smoothly insert the bus bar frame 222 into the module housing 210.

For example, referring to FIG. 12, the support plate 222b protruding and extending in the center direction of the cell assembly 100 may be formed on the body portion 222a of the bus bar frame 222 so as to support the lower portion of the cell assembly 100 in the upper direction. In addition, the support plate 222b has the sharp edge portion 222b1 having the end line L2 sharp in the center, and thus the support plate 222b may easily enter into the module housing 210.

In addition, the support plate 222b may be configured such that the support plate 222b of the bus bar frame 222 may be more easily assembled inside the module housing 210. In addition, the support plate 222b may have an incline structure 222b2 in which the thickness becomes thinner toward the end of the cell assembly 100 in the center direction. For example, as shown in FIG. 13, the incline structure 222b2 of the support plate 222b may be formed such that the thickness becomes thinner toward the end line L2 in the extending direction. That is, the thickness of the sharp edge portion 222b1 in the upper and lower direction may be thinner toward the end portion.

Therefore, according to this configuration of the present disclosure, since the incline structure 222b2 in which the thickness becomes thinner toward the end in the extending direction on the support plate 222b may be formed, when assembling the battery module 200, an entrance of the module housing 210 may be slightly opened by the incline structure of the support plate 222b.

Figure 14:
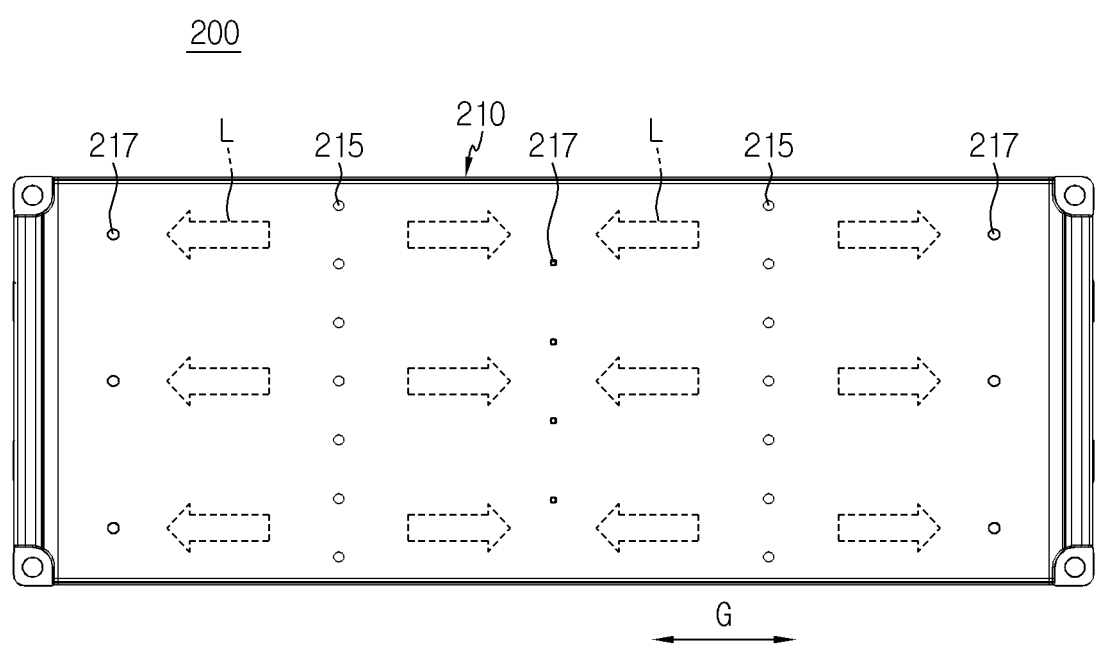
FIG. 14 is a bottom view schematically showing a battery module according to an embodiment of the present disclosure.

FIG. 14 is a bottom view schematically showing a battery module according to an embodiment of the present disclosure. The arrow L in FIG. 14 indicates a direction of movement of a thermally conductive material.

Referring to FIG. 14 together with FIG. 3, at least one injection hole 215 for injecting the thermally conductive material (not shown) in the lower surface of the module housing 210 may be formed in the battery module 200 of the present disclosure. For example, as illustrated in FIG. 14, fourteen injection holes 215 spaced apart from each other at predetermined intervals and arranged in two rows in the left and right direction may be provided in the lower surface of the module housing 210. The injection holes 215 in the first row and the injection holes 215 in the second row may be located at a predetermined distance from each other in the front and back direction G with respect to the center of the lower surface of the module housing 210. Here, the thermally conductive material may be, for example, a silicone-based polymer, a urethane-based polymer, or a ceramic material.

In addition, a plurality of checking holes 217 are further formed in the center region of the lower surface of the module housing 210 and both edge regions in the front and back direction G of the module housing 210. Specifically, the checking hole 217 is used to determine whether the thermally conductive material injected through the injection hole 215 has penetrated to a region where the checking hole 217 is formed. At this time, when the thermally conductive material is determined in the checking hole 217, an amount of injection of the thermally conductive material is controlled by stopping the injection of the thermally conductive material. Moreover, the checking hole 217 may serve as a passage through which air located inside the module housing 210 escapes while the thermally conductive material is injected through the injection hole 215.

Therefore, according to this configuration of the present disclosure, the injection hole 215 into which the thermally conductive material is injected and the checking hole 217 through which the injected thermally conductive material penetrates are provided in the lower surface of the module housing 210, thereby inducing the thermally conductive material to spread evenly inside the module housing 210 and advantageously functioning to uniformly distribute the thermally conductive material inside the module housing 210.

Meanwhile, a battery pack (not shown) according to an embodiment of the present disclosure includes one or more battery module 200 described above. The battery pack may further include a pack case (not shown) for accommodating the battery module 200, various devices (not shown) for controlling charging and discharging of the battery module 200, for example, a battery management system (BMS), a current sensor, a fuse, etc.

In addition, the battery pack according to an embodiment of the present disclosure may be included in a vehicle such as an electric vehicle or a hybrid vehicle. That is, a vehicle according to an embodiment of the present disclosure may include the battery pack according to an embodiment of the present disclosure described above.

Meanwhile, in the present specification, although the terms indicating directions such as up, down, left, right, front, and back are used, it is apparent to those skilled in the art that these terms are for convenience of explanation only and vary depending on the position of a target object or the position of an observer.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

| [Description of Reference Numerals] | |
| --- | --- |
| 200: battery module | 100: cell assembly |
| 110: secondary battery | 111: electrode lead |
| 210: module housing | |
| C2: chamfer | 213: linear protrusion |
| 220: bus bar assembly | 222, 224: bus bar frame |
| 222a: body portion | 222c, 222c1: fastening portion, fixture |
| 222b: support plate | |
| 225: bus bar | 240: inner cover |
| 241: plate portion | |
| C1: chamfer | 245: coupling portion |
| 243: guide groove | 244: C-shaped hook |
| 241h: insertion groove | 250: protection circuit module |
| 254: printed circuit board | 252: voltage sensing terminal |

INDUSTRIAL APPLICABILITY

The present disclosure relates to a battery module including an inner cover. In addition, the present disclosure is applicable to an industry related to a battery pack including at least one battery module and a vehicle including the battery pack.

What is claimed is:
1. A battery module comprising:
a cell assembly provided with a plurality of secondary batteries mutually stacked in a left to right direction, each of the plurality of secondary batteries having an electrode lead protruding in a front and back direction;
a bus bar assembly provided with a bus bar frame located on a front side or a rear side of the cell assembly, the bus bar frame having a plate-shaped body portion, and a bus bar mounted on an outer surface of the bus bar frame, the bus bar having a conductive metal to electrically connect the electrode leads of the plurality of secondary batteries to each other;

an inner cover provided with a plate portion located on an outer side of the cell assembly, the inner cover formed with a first chamfer on an outer peripheral portion of a front edge of the inner cover, the first chamfer extending to a top surface of the inner cover, and a coupling portion coupled to a first end portion of the body portion of the bus bar frame on a part of the outer peripheral portion of the plate portion;

a module housing having a tube shape with a top wall, a bottom wall and sidewalls, a first open end and a second open end; and a second chamfer formed in the top wall at the first open end, the second chamfer extending to a bottom surface of the top wall.

2. The battery module of claim 1, wherein the plate portion is a rectangular plate and is formed with the first chamfer on an end portion of each of a back edge, a left edge and a right edge.

3. The battery module of claim 1, wherein the first end portion of the body portion of the bus bar frame is provided with a fastening portion coupled to the coupling portion of the inner cover in a hinge coupling structure.

4. The battery module of claim 1, further comprising at least one protrusion formed on the bottom surface of the top wall of the module housing; and at least one guide groove formed between side edges of the top surface of the inner cover and indented in an inner direction such that the at least one protrusion is inserted therein.

5. The battery module of claim 1, wherein the body portion of the bus bar frame is provided with a protrusion portion protruding in an inner direction, and wherein the plate portion of the inner cover is formed with an insertion groove recessed in the inner direction such that the protrusion portion is inserted into one end portion of the plate portion.

6. The battery module of claim 1, further comprising a linear protrusion formed between side edges of the bottom surface of the top wall of the module housing and protruding in an inner direction and extending to the open ends of the module housing; and a guide groove formed between side edges of the top surface of the inner cover and indented in the inner direction such that the linear protrusion is inserted therein.

7. The battery module of claim 1, wherein the battery module further comprises a protection circuit module, wherein the protection circuit module comprises:

a printed circuit board extending in the front and back direction and engraved with a wiring pattern; and a voltage sensing terminal formed in end portions of the printed circuit board in the front and back direction and provided with a wiring to measure a voltage of the secondary battery, and wherein an indentation portion indented inwardly is provided on an inner lower surface of the plate portion of the inner cover such that at least a part of the printed circuit board is inserted into the indentation portion.

8. The battery module of claim 1, wherein a support plate protruding and extending in an inner direction to support a part of the cell assembly in an upper direction is provided on a lower end of the body portion of the bus bar frame.

9. The battery module of claim 8, wherein the support plate has an end line in which a width of at least a part of the support plate is continuously reduced toward the inner direction so as to have a sharp center part.

10. The battery module of claim 8, wherein the support plate has an incline structure in which a thickness of the support plate becomes thinner toward an end in the inner direction.

11. A battery pack comprising at least one battery module of claim 1.

12. A vehicle comprising the battery pack of claim 11.

* * * * *